(12) United States Patent
Kim

(10) Patent No.: US 8,330,180 B2
(45) Date of Patent: Dec. 11, 2012

(54) SEMICONDUCTOR LIGHT EMITTING DEVICE AND METHOD OF FABRICATING THE SAME

(75) Inventor: Sung Kyoon Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 311 days.

(21) Appl. No.: 12/445,189

(22) PCT Filed: Dec. 12, 2008

(86) PCT No.: PCT/KR2008/007391
§ 371 (c)(1),
(2), (4) Date: Apr. 10, 2009

(87) PCT Pub. No.: WO2009/075552
PCT Pub. Date: Jun. 18, 2009

(65) Prior Publication Data
US 2010/0193826 A1    Aug. 5, 2010

(30) Foreign Application Priority Data
Dec. 13, 2007    (KR) .................. 10-2007-0129745

(51) Int. Cl.
*H01L 33/00*    (2010.01)

(52) U.S. Cl. .................. 257/99; 257/98; 257/E33.074
(58) Field of Classification Search .................. 257/99, 257/E33.074
See application file for complete search history.

(56) References Cited

U.S. PATENT DOCUMENTS

| 6,735,230 B1 * | 5/2004 | Tanabe et al. ............. 372/43.01 |
| 2004/0014400 A1 * | 1/2004 | Cherian et al. ................. 451/41 |
| 2006/0267034 A1 | 11/2006 | Orita |

FOREIGN PATENT DOCUMENTS

| JP | 2005-5679 A | 1/2005 |
| JP | 2005-72585 A | 3/2005 |
| JP | 2005-109207 A | 4/2005 |
| KR | 10-0762004 B1 | 9/2007 |
| KR | 10-0798863 B1 | 1/2008 |

* cited by examiner

*Primary Examiner* — Thien F Tran
(74) *Attorney, Agent, or Firm* — Birch, Stewart, Kolasch & Birch, LLP

(57) ABSTRACT

Provided are a semiconductor light emitting device and a method of fabricating the same. The semiconductor light emitting device comprises a first conductive semiconductor layer, an active layer on the first conductive semiconductor layer, a second conductive semiconductor layer, and an electrode layer comprising a conductive polymer on the second conductive semiconductor layer.

20 Claims, 4 Drawing Sheets

SEMICONDUCTOR LIGHT EMITTING DEVICE AND METHOD OF FABRICATING THE SAME

TECHNICAL FIELD

The present disclosure relates to a semiconductor light emitting device and a method of fabricating the same.

BACKGROUND ART

Group III-V nitride semiconductors have been variously applied to optical devices such as blue and green light emitting diodes (LEDs), high speed switching devices such Metal Semiconductor Field Effect Transistor (MOSFET) and Hetero junction Field Effect Transistor (HEMT), and light sources of lighting devices or display devices. In particular, light emitting devices using group III nitride semiconductors have a direct transition-type bandgap corresponding to the range from visible rays to ultraviolet rays, and can realize high-efficiency light emission.

The nitride semiconductors are mainly used for LEDs or laser diodes (LDs), and studies have been continuously conducted to improve the fabrication process or light efficiency of the nitride semiconductors.

DISCLOSURE

Technical Problem

Embodiments provide a light emitting device comprising an electrode layer using a conductive polymer, and a method of fabricating the same.

Embodiments provide a semiconductor light emitting device that is designed to form an electrode layer comprising a roughness using a conductive polymer, and a method of fabricating the same.

Technical Solution

An embodiment provides a semiconductor light emitting device comprising: a first conductive semiconductor layer; an active layer on the first conductive semiconductor layer; a second conductive semiconductor layer; and an electrode layer comprising a conductive polymer on the second conductive semiconductor layer.

An embodiment provides a semiconductor light emitting device comprising: a first conductive semiconductor layer; an active layer on the first conductive semiconductor layer; a transmissive electrode layer comprising a roughness patterns and a conductive polymer on the second conductive semiconductor layer; and a second electrode contacting at least one of the second conductive semiconductor layer and the transmissive electrode layer.

An embodiment provides a method of fabricating a semiconductor light emitting device comprising: forming a first conductive semiconductor layer, an active layer, and a second conductive semiconductor layer; forming a second electrode in a first region on the second conductive semiconductor layer; and forming an electrode layer of a conductive polymer in a second region on the second conductive semiconductor layer.

Advantageous Effects

According to the embodiments, the current diffusion can be improved by the electrode layer formed of the conductive polymer.

According to the embodiments, external quantum efficiency can be improved through the electrode layer formed of the conducive polymer and the roughness formed on its top surface.

According to the embodiments, the fabrication process of the electrode layer can be improved.

According to the embodiments, the costs of the electrode layer can be reduced.

BEST MODE

Reference will now be made in detail to the embodiments of the present disclosure, examples of which are illustrated in the accompanying drawings.

In the description, it is understood that when a layer (or film) is referred to as being "on" another layer or substrate, it can be directly on the other layer or substrate, or intervening layers may also be present. Further, it will be understood that when a layer is referred to as being "under" another layer, it can be directly under the other layer, and one or more intervening layers may also be present. In addition, "on" and "under" of each layer will be referred to based on the drawings. Further, the thickness of each layer is exemplarily illustrated and thus the actual thickness of each layer is not limited to the drawings.

Figure 1:
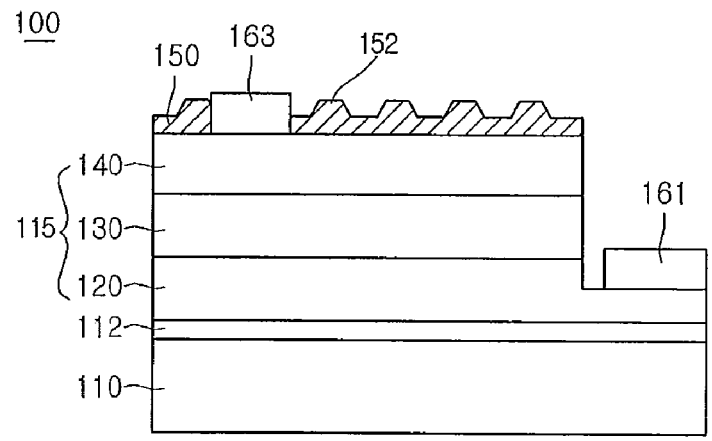
FIG. 1 is a side sectional view of a semiconductor light emitting device according to a first embodiment.
Figure 2:
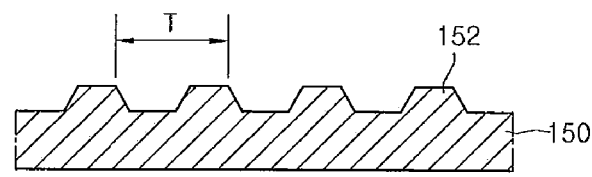
FIG. 2 is a sectional view of an electrode layer of FIG. 1.

FIG. 1 is a side sectional view of a semiconductor light emitting device according to a first embodiment, and FIG. 2 is a sectional view of an electrode layer of FIG. 1.

Referring to FIG. 1, a semiconductor light emitting device 100 comprises a substrate 110, a buffer layer 112, a light emitting structure 115, a first electrode 161, a second electrode 163, and an electrode layer 150 using a conductive polymer.

The substrate 110 may be formed of a material selected from the group consisting of sapphire ($Al_2O_3$), GaN, SiC, ZnO, Si, GaP, and GaAs. If necessary, the substrate 110 may be removed.

The buffer layer 112 is formed on the substrate 110. The buffer layer 112 is a layer for reducing a lattice constant difference from the substrate 110. The buffer layer 112 may be formed to a predetermined thickness (for example, 150-1,000 Å) by selectively using GaN, AlN, AlGaN, InGaN, or AlInGaN. An undoped semiconductor layer (not shown) may be formed on the buffer layer 112. The undoped semiconductor layer may be formed of undoped GaN-based semiconductors. At least one of the buffer layer 112 and the undoped semiconductor layer (not shown) may be formed on the substrate 110, or neither of them may be formed.

The light emitting structure 115 is formed on the buffer layer 112. The light emitting structure 115 comprises a first conductive semiconductor layer 120, an active layer 130, and a second conductive semiconductor layer 140. The light emitting structure 115 may be formed by P-N junction, N-P junction, or N-P-N junction within the technical scope of the embodiment. Another semiconductor layer may be further formed on or under the respective layers, and the present invention is not limited to a stacked structure of those components.

The first conductive semiconductor layer 120 may be formed of a semiconductor having a composition formula of $In_xAl_yGa_{1-x-y}N$ ($0 \leq x \leq 1$, $0 \leq y \leq 1$, $0 \leq x+y \leq 1$), and it is doped with a first conductive dopant. The first conductive semiconductor layer 120 may be selected from InAlGaN, GaN, AlGaN, and InGaN which are composed of group III elements and group V elements. When the first conductive semiconductor layer 120 is an N-type semiconductor layer, the first conductive dopant is an N-type dopant, and the N-type dopant comprises Si, Ge, Sn, or the like.

The active layer 130 is formed on the first conductive semiconductor layer 120. The active layer 130 has a single quantum well structure or a multiple quantum well structure. The active layer 130 may comprise a period of a well layer and a barrier layer, for example, a period of an InGaN well layer/GaN barrier layer or a period of an AlGaN well layer/GaN barrier layer, by using group III-V compound semiconductor materials.

The active layer 130 is formed of a material having a bandgap energy according to a light wavelength at which light is emitted. For example, in the case of a blue light emission having a wavelength of 460-470 nm, the active layer 130 may be formed in a single or multiple quantum well structure at a period of an InGaN well layer/GaN barrier layer. The active layer 130 may comprise a material emitting a colored light such as a blue wavelength light, a red wavelength light, and a green wavelength light.

A conductive clad layer (not shown) may be formed on an/or under the active layer 130, and the conductive clad layer may comprise an AlGaN layer.

The second conductive semiconductor layer 140 is formed on the active layer 130. The second conductive semiconductor layer 140 may be formed of a semiconductor having a composition formula of $In_xAl_yGa_{1-x-y}N$ ($0 \leq x \leq 1$, $0 \leq y \leq 1$, $0 \leq x+y \leq 1$), and it is doped with a second conductive dopant. The second conductive semiconductor layer 140 may be selected from InAlGaN, GaN, AlGaN, and InGaN which are composed of a combination of group III elements and group V elements. When the second conductive semiconductor layer 140 is a P-type semiconductor layer, the second conductive dopant is a P-type dopant, and the P-type dopant comprises Mg, Zn, Ca, Sr, Ba, or the like.

Furthermore, a third conductive semiconductor layer (not shown) may be formed on the second conductive semiconductor layer 140. When the second conductive semiconductor layer is a P-type semiconductor layer, the third conductive semiconductor layer may be an N-type semiconductor layer. When the second conductive semiconductor layer is an N-type semiconductor layer, the third conductive semiconductor layer may be a P-type semiconductor layer.

The first electrode 161 is formed at a portion of the first conductive semiconductor layer 120, and the second electrode 163 is formed in a first region on the second conductive semiconductor layer 140.

The electrode layer 150 is formed in a second region on the second conductive semiconductor layer 140. The second electrode layer 150 is formed on the top surface of the second conductive semiconductor layer 140, except the first region, and it contacts a side of the second electrode 163.

The electrode layer 150 is formed of a conductive polymer. In this case, examples of the intrinsically conductive polymer may comprise polyacetylene, polyaniline, polypyrrole, polythiophene, poly(p-phenylene vinylene), thiophene ($C_4H_4S$)-based derivative (for example, 3,4-ethylenedioxythiophene (EDOT)), or the like. An N-type or P-type dopant may be doped into the conductive polymer.

The electrode layer 150 is formed of a conductive layer and has a conduction characteristic and a transmission characteristic.

In addition, the top surface of the electrode layer 150 may have roughness shaped or concave-convex shaped patterns (hereinafter, referred to as roughness patterns). The roughness patterns may be formed at constant periods (T) and may be in a polygonal shape, a pyramid shape, or a random shape.

The electrode layer 150 contacts the second electrode 163. When current is supplied to the second electrode 163, the electrode layer 150 diffuses the locally crowded electrons to the whole area. That is, the electrode layer 150 improves the light emission efficiency of the active layer 130 by dispersing the electrons injected into the second electrode 163.

Furthermore, the roughness patterns 152 of the electrode layer 150 can improve external quantum efficiency by changing a critical angle of light emitted from the active layer 130.

The electrode layer 150 may be disposed in the conductive semiconductor layer on and/or under the light emitting structure 115. Such a position is not limited to the above configuration.

FIGS. 3 to 7 are sectional views illustrating a method of fabricating a semiconductor light emitting device according to a first embodiment.

Figure 3:
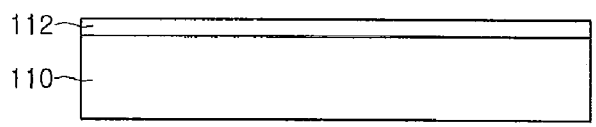
FIGS. 3 to 7 are sectional views illustrating a method of fabricating a semiconductor light emitting device according to a first embodiment.

Referring to FIG. 3, a buffer layer 112 is formed on a substrate 110. The buffer layer 112 is a layer for reducing a lattice constant difference from the substrate 110. The buffer layer 112 may be formed by selectively using GaN, AlN, AlGaN, InGaN, or AlInGaN. An undoped semiconductor layer (not shown) may be formed on the substrate 110 or the buffer layer 112. The buffer layer 112 may not be formed.

Figure 4:
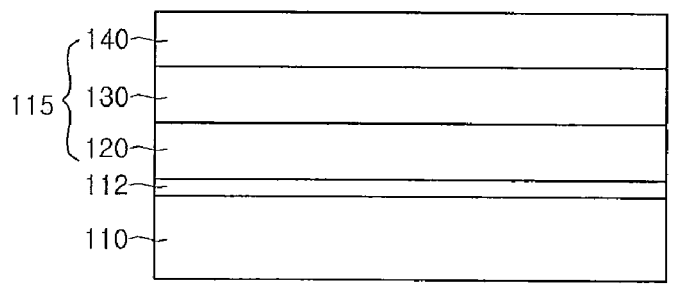

Referring to FIG. 4, a light emitting structure 115 is formed on the buffer layer 112. The light emitting structure 115 comprises a first conductive semiconductor layer 120, an active layer 130, and a second conductive semiconductor layer 140.

The first conductive semiconductor layer 120 is formed on the buffer layer 112. The first conductive semiconductor layer 120 may be formed of a semiconductor having a composition formula of $In_xAl_yGa_{1-x-y}N$ ($0 \leq x \leq 1$, $0 \leq x \leq 1$, $0 \leq x+y \leq 1$), and it is doped with a first conductive dopant. The first conductive semiconductor layer 120 may be selected from InAlGaN, GaN, AlGaN, and InGaN which are composed of group III elements and group V elements. When the first conductive semiconductor layer 120 is an N-type semiconductor layer, the first conductive dopant is an N-type dopant, and the N-type dopant comprises Si, Ge, Sn, or the like.

The active layer 130 is formed on the first conductive semiconductor layer 120. The active layer 130 has a single quantum well structure or a multiple quantum well structure. The active layer 130 may be formed at a period of a well layer and a barrier layer, for example, a period of an InGaN well layer/GaN barrier layer or a period of an AlGaN well layer/GaN barrier layer, by using group III-V compound semiconductor materials.

A conductive clad layer (not shown) may be formed on an/or under the active layer 130, and the conductive clad layer may comprise an AlGaN layer.

The second conductive semiconductor layer 140 is formed on the active layer 130. The second conductive semiconductor layer 140 may be formed of a semiconductor having a composition formula of $In_xAl_yGa_{1-x-y}N$ ($0 \leq x \leq 1$, $0 \leq y \leq 1$, $0 \leq x+y \leq 1$), and it is doped with a second conductive dopant. The second conductive semiconductor layer 140 may be selected from InAlGaN, GaN, AlGaN, and InGaN which are composed of a combination of group III elements and group V elements. When the second conductive semiconductor layer 140 is a P-type semiconductor layer, the second conductive dopant is a P-type dopant, and the P-type dopant comprises Mg, Zn, Ca, Sr, Ba, or the like.

Furthermore, a third conductive semiconductor layer (not shown) may be formed on the second conductive semiconductor layer 140. When the second conductive semiconductor layer is a P-type semiconductor layer, the third conductive semiconductor layer may be an N-type semiconductor layer. When the second conductive semiconductor layer is an N-type semiconductor layer, the third conductive semiconductor layer may be a P-type semiconductor layer.

Figure 5:
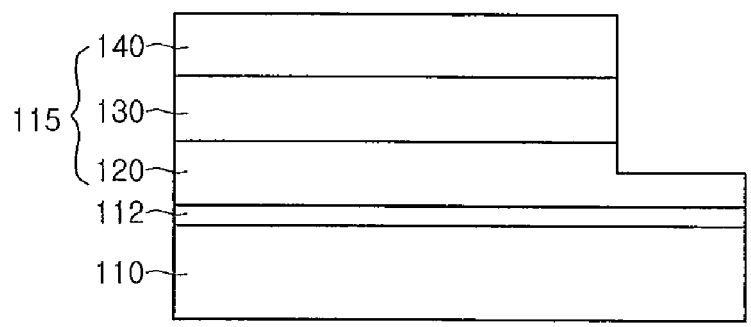

Referring to FIG. 5, a mesa etching is performed on the light emitting structure 115. Due to the mesa etching, a portion of the first conductive semiconductor layer 120 is exposed.

Figure 6:
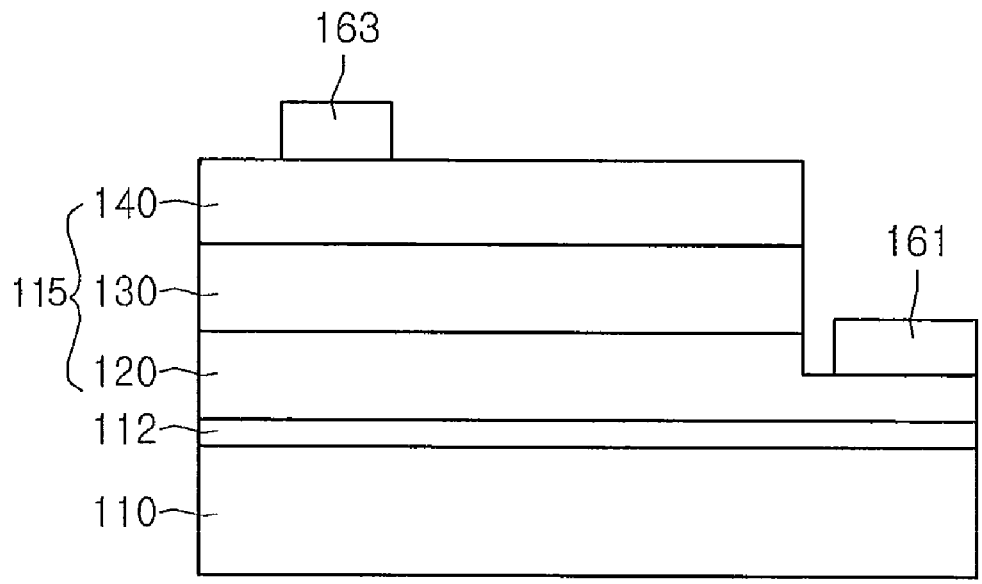

Referring to FIGS. 5 and 6, a first electrode 161 is formed on the first conductive semiconductor layer 120, and a second electrode 163 is formed on the second conductive semiconductor layer 140. The second electrode 163 is formed in a first region which is a portion of the second conductive semiconductor layer 140. The second electrode 163 may be formed of, but is limited to, at least one layer selected from Ag, Ag alloy, Ni, Al, Al alloy, Rh, Pd, Ir, Ru, Mg, Zn, Pt, Au, and Hf.

After the first electrode 161 and the second electrode 163 are formed in the light emitting structure 115, a post-processing is performed to make individual chips. The post-processing polishes the substrate 110 to a predetermined thickness through a lapping process and a polishing process, and separates the substrate 110 into individual chips through a scribing process and a breaking process.

The lapping process grinds the lower portion of the substrate 110 and polishes the lapped surface to make it smooth. The lapping process is performed by a chemical mechanical polishing (CMP), an ICP/RIE dry etching, a mechanical polishing using sapphire ($Al_2O_3$) powder, or a wet etching using a mixed solution containing any one or more of HCl, $HNO_3$, KOH, NaOH, $H_2SO_4$, $H_3PO_4$, $4H_3PO_4+4CH_3COOH+HNO_3+H_2O$, and combinations thereof as an etchant. In this case, the thickness of the substrate 110 may be in a range of about 20 µm to about 400 µm, but it is not limited thereto.

The scribing process may be performed by a laser scribing process or a tip scribing process. The scribing process is performed through the substrate or the second conductive semiconductor layer. The post-processing may be modified within the technical scope, and it is not limited to the above-described contents.

Figure 7:
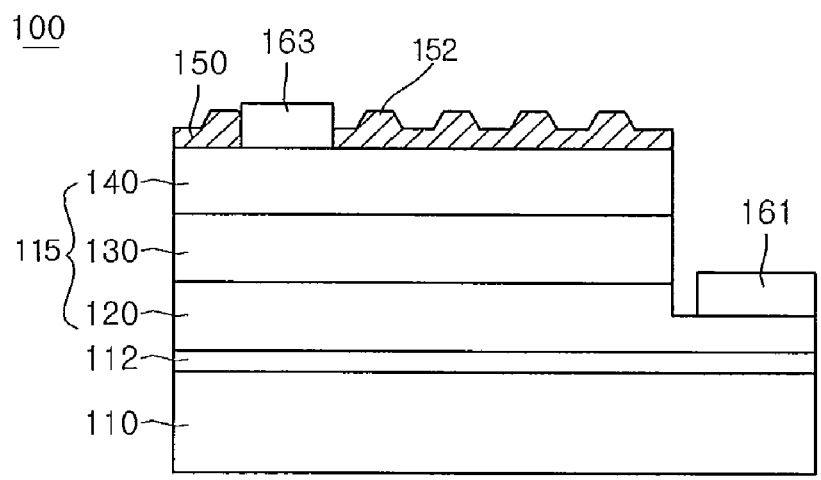

Referring to FIG. 7, when the substrate 110 is separated into the individual chips, an electrode layer 150 using a conductive polymer is formed on the second conductive semiconductor layer 140. The electrode layer 150 is formed in a region where the second electrode 163 is not formed, and its top surface is formed with roughness patterns. The electrode layer 150 electrically contacts the side of the second electrode 163.

The first electrode 161 and/or the second electrode 163 may be formed before or after the formation of the electrode layer 150. In case where the second electrode 160 is formed after the formation of the electrode layer 150, this process may be performed within a range at which the polymer configuration of the conductive polymer used as the material of the electrode layer 150 is not changed by temperature. In this case, the second electrode 163 may be formed on the electrode layer 150 or may be formed on the second conductive semiconductor layer 140 through an etching process.

The electrode layer 150 diffuses the current supplied through the second electrode 163, thereby preventing current crowding. Thus, ESD (electrostatic discharge) improvement effect can be obtained and luminous efficiency can be improved. Furthermore, the electrode layer 150 can improve light intensity by changing the critical angle of light emitted through the roughness patterns 152.

Figure 8:
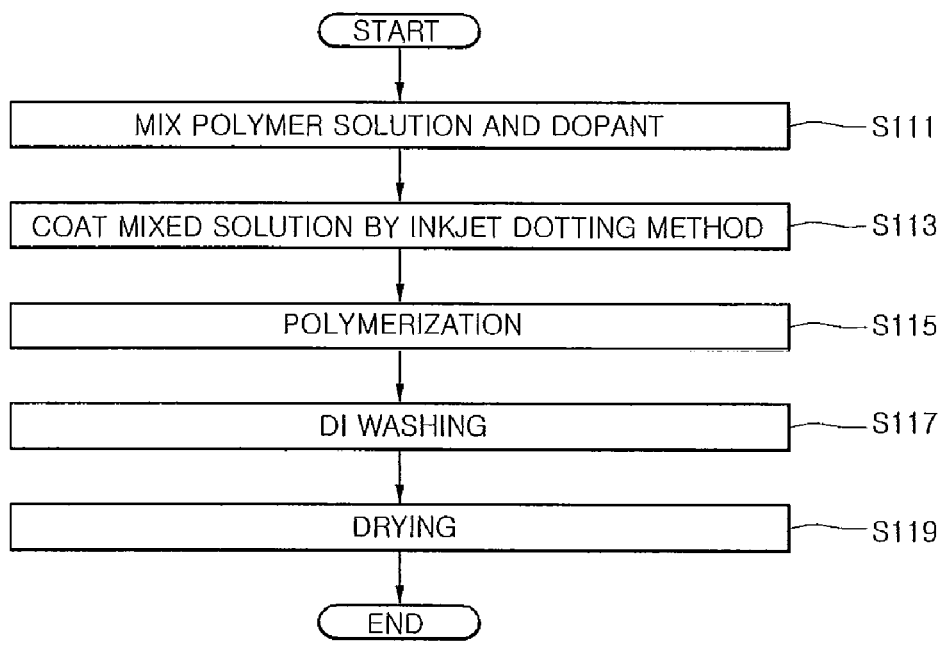
FIG. 8 is a flowchart illustrating a process of forming an electrode layer according to a first embodiment.

FIG. 8 is a flowchart illustrating a process of forming an electrode layer according to a first embodiment.

Referring to FIG. 8, a polymer solution and a dopant are mixed (S111). A solvent of polymer is a solvent that can dissolve polymer, and uses an organic solvent containing —OH radical in a chemical formula.

An amount of polymer participating in the reaction is changed according to the solubility of polymer. The organic solvent may dissolve the polymer or dopant.

The dopant is a material that adjusts the doping degree in the polymer solution, and the solution may be used as a negative or positive doping solution by the dopant.

Examples of the polymer may comprise polyacetylene, polyaniline, polypyrrole, polythiophene, poly(p-phenylene vinylene), thiophene($C_4H_4S$)-based derivative (for example, 3,4-ethylenedioxythiophene (EDOT)), or the like. The dopant may selectively contain Iron-p-toluenesulfonate(Fe$(OTs)_3$) or iodine($I_2$).

The organic solvent is used for dissolving the polymer or dopant, and uses a solvent containing —OH radical. For example, examples of the organic solvent are as follows.

TABLE 1

| solvents | chemical formula | dielectric constant | boiling point (° C.) | Molecular Weight (g/mol) |
|---|---|---|---|---|
| Methanol | $CH_3OH$ | 32.6 | 65 | 32 |
| Ethanol | $CH_3CH_2OH$ | 24.3 | 78 | 46.1 |
| n-Butanol | $CH_3(CH_2)_3OH$ | 7.8 | 118 | 74.1 |
| Hexanol | $CH_3(CH_2)_5OH$ | 13.3 | 154 | 102.2 |
| Acetone | $CH_3COCH_3$ | 20.7 | 56 | 58.1 |
| Methyl Ethyl Ketone | $CH_3CH_2COCH_3$ | 18.4 | 80 | 72.1 |

The mixed solution of the polymer solution and the dopant are mixed is coated on the second conductive semiconductor layer by an inkjet dotting method (S113). Thereafter, a polymerization is performed (S115). The polymerization process is performed within a temperature of 150-200° C. At this point, as alcoholic solvent is evaporated, the polymer and the dopant react with each other to make a polymer. The polymerization process may be changed according to characteristics of the alcoholic solvent.

A polymerization speed can be adjusted by using a mixture of a high-density or low-density polyethylene and the dopant as the polymerization radical. The high-density or low-density polyethylene mixed with the dopant can generate the roughness on the top surface of the electrode layer even though the roughness is not deliberately generated.

Although the inkjet dotting method is used herein, the mixed solution can also be printed by a printing method (for example, a screen printing method).

After the polymerization process is completed, the dopant that does not participate in the reaction is washed by deionized water (DI) (S117) and then dried (S119). Therefore, the electrode layer can be formed on the top surface of the second conductive semiconductor layer, and the electrode layer contacts the second electrode.

In the semiconductor light emitting device, the roughness can be formed at the same time by forming the electrode layer on the second conductive semiconductor layer by using the conducive polymer. Furthermore, compared with the existing electrode layer, the fabrication time and loss of the equipment used can be reduced. Moreover, since the conductive polymer having high doping degree has the same sheet resistance as ITO, the electrode layer formed of the conductive polymer can diffuse the locally input electrons to a wider area. Thus, ESD resistance can be improved and luminous efficiency can be improved.

Figure 9:
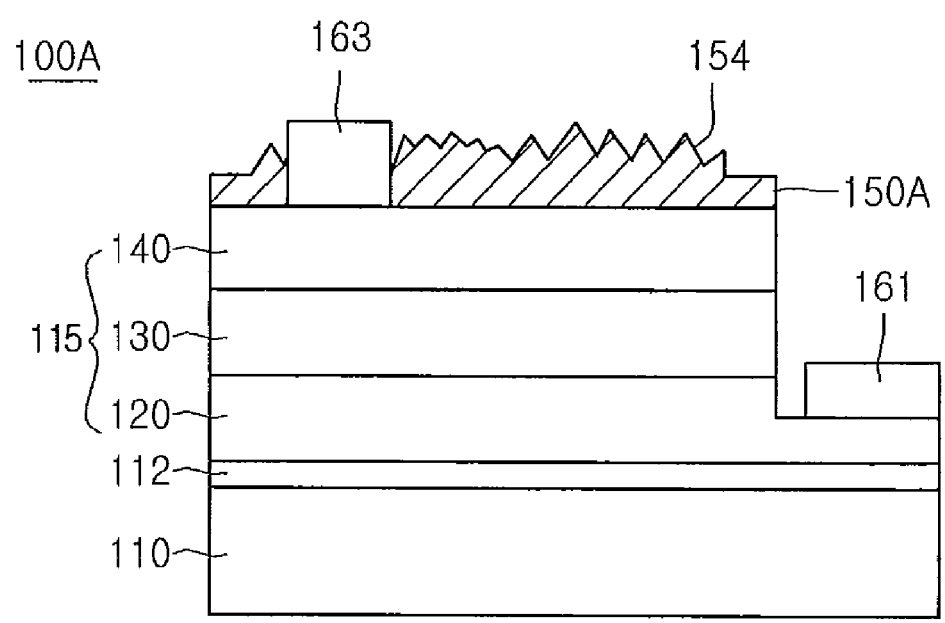
FIG. 9 is a side sectional view of a semiconductor light emitting device according to a second embodiment.

FIG. 9 is a side sectional view of a semiconductor light emitting device according to a second embodiment. The second embodiment having the same contents as the first embodiment will be described with reference to the first embodiment.

Referring to FIG. 9, the semiconductor light emitting device 100A comprises a substrate 110, a buffer layer 112, a light emitting structure 115, a first electrode 161, a second electrode 163, and an electrode layer 150A having uneven roughness patterns 154.

The electrode layer 150A is formed to have uneven roughness patterns 154 on its top surface. The uneven roughness patterns 154 may be formed at irregular periods and irregular shapes. The electrode layer 150A directly contacts the second electrode 163 and disperses the current injected into the second electrode 163. The roughness patterns 154 can improve external quantum efficiency.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Industrial Applicability

The embodiments can provide the semiconductor light emitting device.

The embodiments can provide the electrode layer using the conductive polymer in the semiconductor light emitting device.

The invention claimed is:

1. A semiconductor light emitting device, comprising:
   a first conductive semiconductor layer;
   an active layer on the first conductive semiconductor layer;
   a second conductive semiconductor layer on the active layer; and
   an electrode layer comprising a conductive polymer doped with a dopant, the electrode layer on the second conductive semiconductor layer,
   wherein the conductive polymer comprises at least one of polyacetylene, polythiophene, poly(p-phenylene vinylene) (PPV), and thiophene($C_4H_4S$)-based derivative.

2. The semiconductor light emitting device according to claim 1, comprising an N-type semiconductor layer or a P-type semiconductor layer between the second conductive semiconductor layer and the electrode layer.

3. The semiconductor light emitting device according to claim 1, wherein the dopant comprises at least one of Iron-p-toluenesulfonate ($Fe(OTs)_3$) and iodine($I_2$).

4. The semiconductor light emitting device according to claim 1, wherein a top surface of the electrode layer comprises roughness patterns.

5. The semiconductor light emitting device according to claim 4, wherein the roughness patterns comprise at least one of a concave-convex shape, a polygonal shape, and a pyramid shape.

6. The semiconductor light emitting device according to claim 1, wherein the conductive polymer comprises a high-density polyethylene with the dopant or a low-density polyethylene with the dopant.

7. The semiconductor light emitting device according to claim 1, wherein an N-type dopant is doped into the conductive polymer.

8. The semiconductor light emitting device according to claim 1, wherein a P-type dopant is doped into the conductive polymer.

9. The semiconductor light emitting device according to claim 1, wherein the conductive polymer is formed in a transmissive conductive polymer.

10. The semiconductor light emitting device according to claim 1, further comprising a first electrode on the first conductive semiconductor layer and a second electrode on the second conductive semiconductor layer.

11. The semiconductor light emitting device according to claim 1, further comprising a substrate under the first conductive semiconductor layer.

12. A semiconductor light emitting device, comprising:
    a first conductive semiconductor layer;
    an active layer on the first conductive semiconductor layer;
    a second conductive semiconductor layer on the active layer;
    a transmissive electrode layer comprising roughness patterns and a conductive polymer doped with a dopant, the transmissive electrode layer on the second conductive semiconductor layer; and
    a second electrode on the second conductive semiconductor layer,
    wherein a side surface of the transmissive electrode layer is in contact with a side surface of the second electrode, and
    wherein the second electrode and the transmissive electrode layer comprise different materials.

13. The semiconductor light emitting device according to claim 12,
    wherein the polymer comprises at least one of polyacetylene, polyaniline, polypyrrole, polythiophene, poly(p-phenylene vinylene) (PPV), and thiophene($C_4H_4S$)-based derivative, and
    wherein the dopant comprises at least one of Iron-p-toluenesulfonate ($Fe(OTs)_3$) and iodine($I_2$).

14. The semiconductor light emitting device according to claim 12, wherein the transmissive electrode layer has a width wider than that of the second electrode.

15. The semiconductor light emitting device according to claim 12, further comprising a first electrode on the first conductive semiconductor layer.

16. The semiconductor light emitting device according to claim 12, further comprising a substrate under the first conductive semiconductor layer.

17. The semiconductor light emitting device according to claim 12, wherein the roughness patterns comprise at least one of a concave-convex shape, a polygonal shape, and a pyramid shape.

18. The semiconductor light emitting device according to claim 12, wherein the second electrode comprises at least one of Ag, Ag alloy, Ni, Al, Al alloy, Rh, Pd, Ir, Ru, Mg, Zn, Pt, Au, and Hf.

19. A semiconductor light emitting device, comprising:
a first conductive semiconductor layer;
an active layer on the first conductive semiconductor layer;
a second conductive semiconductor layer on the active layer;
a transmissive electrode layer comprising roughness patterns and a conductive polymer doped with a dopant, the transmissive electrode layer on the second conductive semiconductor layer; and
a second electrode on the second conductive semiconductor layer,
wherein a side surface of the transmissive electrode layer is in contact with a side surface of the second electrode,
wherein the electrode layer has a width wider than that of the second electrode and at least one of the first and second conductive layers is formed of a semiconductor having a composition formula of $In_xAl_yGa_{1-x-y}N$ ($0 \leq x \leq 1$, $0 \leq y \leq 1$, $0 \leq x+y \leq 1$), and
wherein the second electrode and the transmissive electrode layer comprise different materials.

20. The semiconductor light emitting device according to claim 19, further comprising a substrate under the first conductive semiconductor layer.

* * * * *